(12) United States Patent
Wang et al.

(10) Patent No.: US 11,837,810 B2
(45) Date of Patent: Dec. 5, 2023

(54) FLEXIBLE CIRCUIT BOARD, MANUFACTURING METHOD, MOVABLE APPARATUS, AND ELECTRONIC DEVICE

(71) Applicant: Beijing Xiaomi Mobile Software Co., Ltd., Beijing (CN)

(72) Inventors: Hui Wang, Beijing (CN); Zongbao Yang, Beijing (CN)

(73) Assignee: BEIJING XIAOMI MOBILE SOFTWARE CO., LTD., Beijing (CN)

( * ) Notice: Subject to any disclaimer, the term of this patent is extended or adjusted under 35 U.S.C. 154(b) by 72 days.

(21) Appl. No.: 17/646,450

(22) Filed: Dec. 29, 2021

(65) Prior Publication Data

US 2022/0407256 A1 Dec. 22, 2022

(30) Foreign Application Priority Data

Jun. 16, 2021 (CN) .......................... 202110668122.8

(51) Int. Cl.
*H01R 12/79* (2011.01)
*H01R 43/20* (2006.01)
*H04N 23/54* (2023.01)
*H04N 23/68* (2023.01)

(52) U.S. Cl.
CPC ........... *H01R 12/79* (2013.01); *H01R 43/205* (2013.01); *H04N 23/54* (2023.01); *H04N 23/687* (2023.01)

(58) Field of Classification Search
CPC ........ H01R 12/59; H01R 12/61; H01R 12/77; H01R 12/79; H01R 43/205; H01R 23/54; H01R 23/687; H05K 3/365; H05K 3/326; H05K 1/118

USPC ............................................ 439/67, 77, 492
See application file for complete search history.

(56) References Cited

U.S. PATENT DOCUMENTS

| | | | |
|---|---|---|---|
| 6,118,666 A * | 9/2000 | Aoki | H05K 3/365 |
| | | | 174/254 |
| 2007/0077805 A1 | 4/2007 | Nomura et al. | |
| 2009/0097161 A1* | 4/2009 | Naruse | H05K 1/0281 |
| | | | 29/603.07 |
| 2017/0171939 A1* | 6/2017 | Yang | H05B 33/22 |
| 2018/0196300 A1* | 7/2018 | Jung | H01L 51/5246 |
| 2019/0305234 A1* | 10/2019 | Jung | H01L 51/5253 |
| 2019/0341566 A1* | 11/2019 | Lee | H05K 1/147 |

FOREIGN PATENT DOCUMENTS

| | | | |
|---|---|---|---|
| EP | 1833242 A2 | 9/2007 | |
| EP | 2074815 B1 | 5/2013 | |

* cited by examiner

*Primary Examiner* — Gary F Paumen
(74) *Attorney, Agent, or Firm* — McCoy Russell LLP

(57) ABSTRACT

A flexible circuit board includes a main board, a first connecting plate, and a second connecting plate; a side surface of the first connecting plate is connected to a first side surface of the main board, and an included angle between the main board and the first connecting plate is a first preset angle; a side surface of the second connecting plate is connected to the first side surface of the main board, and an included angle between the main board and the second connecting plate is a second preset angle; and the first preset angle and the second preset angle are both greater than 0 degree and less than 180 degrees.

15 Claims, 9 Drawing Sheets

US 11,837,810 B2

FLEXIBLE CIRCUIT BOARD, MANUFACTURING METHOD, MOVABLE APPARATUS, AND ELECTRONIC DEVICE

CROSS REFERENCE TO RELATED APPLICATION

The present application claims priority to the Chinese Patent Application No. 202110668122.8 filed on Jun. 16, 2021. The entire contents of the above-listed application are hereby incorporated by reference for all purposes.

BACKGROUND

Some electronic devices, for example, a camera device with an anti-shaking function, may include a movable member and a fixed member. The movable member may be an image sensor assembly. The fixed member may be an interface part. The movable member and the fixed member are electrically connected, so that the movable member is able to transmit data to the mother board of the electronic device by means of the fixed member.

The electrical connection between the movable member and the fixed member is realized by means of a flexible circuit board. For example, one end of the flexible circuit board is connected to the movable member, and the other end of the flexible circuit board is connected to the fixed member.

In the related art, when the movable member moves relative to the fixed member, the stress of the flexible circuit board on the movable member has a great influence on the movement of the movable member, which is not conducive to the anti-shaking operation of the image sensor assembly.

SUMMARY

This application relates to the technical field of flexible circuit boards, and to a flexible circuit board, a manufacturing method, a movable apparatus, and an electronic device.

On one hand, a flexible circuit board is provided. The flexible circuit board includes a main board, a first connecting plate, and a second connecting plate; in which
   a side surface of the first connecting plate is connected to a first side surface of the main board, and an included angle between the main board and the first connecting plate is a first preset angle; in which
   a side surface of the second connecting plate is connected to the first side surface of the main board, and an included angle between the main board and the second connecting plate is a second preset angle; in which
   the first preset angle and the second preset angle are both greater than 0 degree and less than 180 degrees.

On another hand, a method for manufacturing a flexible circuit board is provided. The method includes:
   providing a flexible substrate;
   performing cutting and circuit manufacturing on the flexible substrate to obtain an initial flexible circuit board, the initial flexible circuit board including a main board, a first connecting plate, and a second connecting plate, and a side surface of the first connecting plate and a side surface of the second connecting plate being both connected to a first side surface of the main board; and
   bending the initial flexible circuit board to obtain a flexible circuit board;
   in which an included angle between the main board and the first connecting plate of the flexible circuit board is a first preset angle, an included angle between the main board and the second connecting plate of the flexible circuit board is a second preset angle, and the first preset angle and the second preset angle are both greater than 0 degree and less than 180 degrees.

On another hand, a movable apparatus is provided. The movable apparatus includes a fixed member, a movable member, and a flexible circuit boards; in which
   the flexible circuit board includes a main board, a first connecting plate, and a second connecting plate; in which
   a side surface of the first connecting plate is connected to a first side surface of the main board, and an included angle between the main board and the first connecting plate is a first preset angle; in which
   a side surface of the second connecting plate is connected to the first side surface of the main board, and an included angle between the main board and the second connecting plate is a second preset angle; in which
   the first preset angle and the second preset angle are both greater than 0 degree and less than 180 degrees; in which
   one of the first connecting plate and the second connecting plate of the flexible circuit board is connected to the fixed member, and the other one is connected to the movable member.

On another hand, an electronic device is provided. The electronic device includes the above movable apparatus.

It should be understood that, the above general description and the following detailed description are merely examples of the present disclosure, and cannot limit this application.

BRIEF DESCRIPTION OF THE DRAWINGS

The accompanying drawings, which are incorporated in and constitute a part of this specification, illustrate examples consistent with this application and together with the specification serve to explain the principles of this application. In the drawings.

Through the above drawings, the specific examples of this application have been shown, which will be described in detail below. These drawings and text descriptions are not intended to limit the scope of the concept of this application in any way, but to explain the concept of this application for those skilled in the art with reference to the specific examples.

DETAILED DESCRIPTION

Examples of the present disclosure will be described in detail herein, examples of which are illustrated in the accompanying drawings. When the following description refers to the accompanying drawings, the same numbers in different drawings represent the same or similar elements unless otherwise indicated. The implementations described in the following examples do not represent all implementations consistent with this application. On the contrary, they are merely examples of an apparatus and a method consistent with some aspects of this application.

Figure 1:
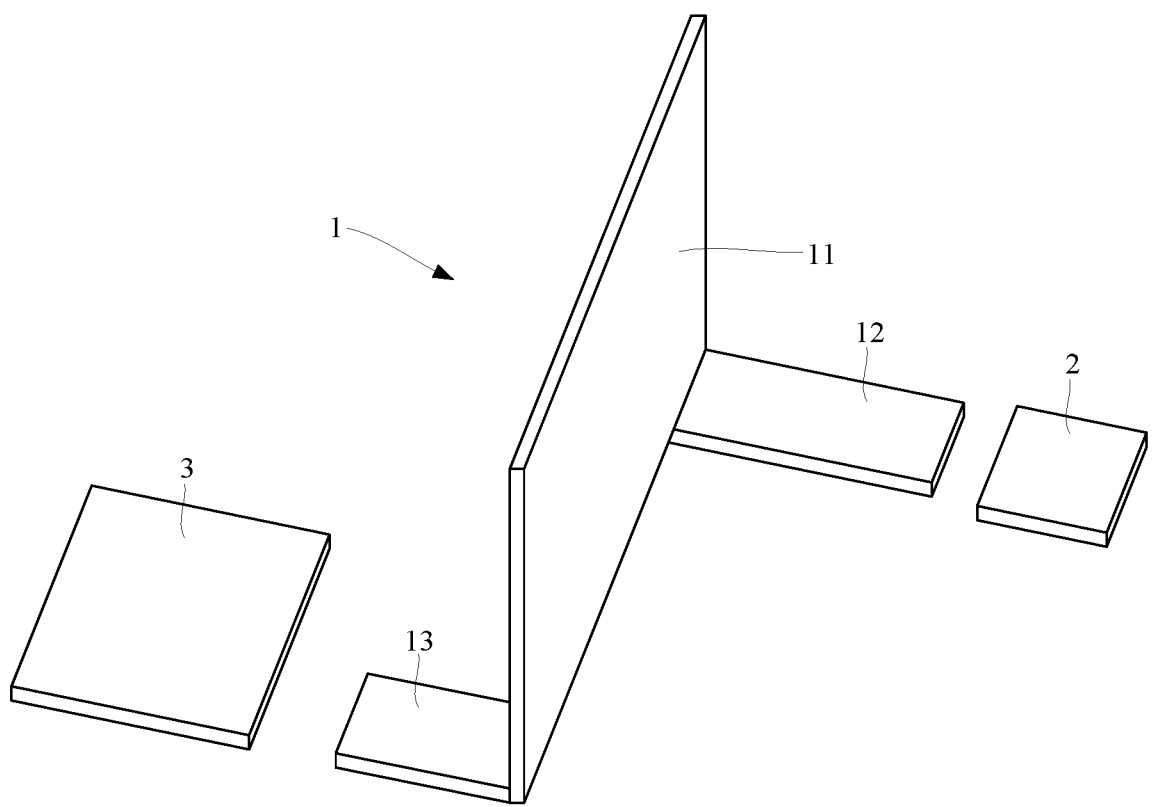
FIG. 1 is a schematic diagram showing an explosive structure of a movable apparatus according to an example.

An example of this application provides a flexible circuit board 1, as shown in FIG. 1, the flexible circuit board 1 may include a main board 11, a first connecting plate 12, and a second connecting plate 13.

The main board 11, the first connecting plate 12, and the second connecting plate 13 are thin plate structures, each may include two plate surfaces and four side surfaces. The positions of the two plate surfaces are opposite to each other. The positions of two of the four side surfaces are opposite to each other.

Figure 2:
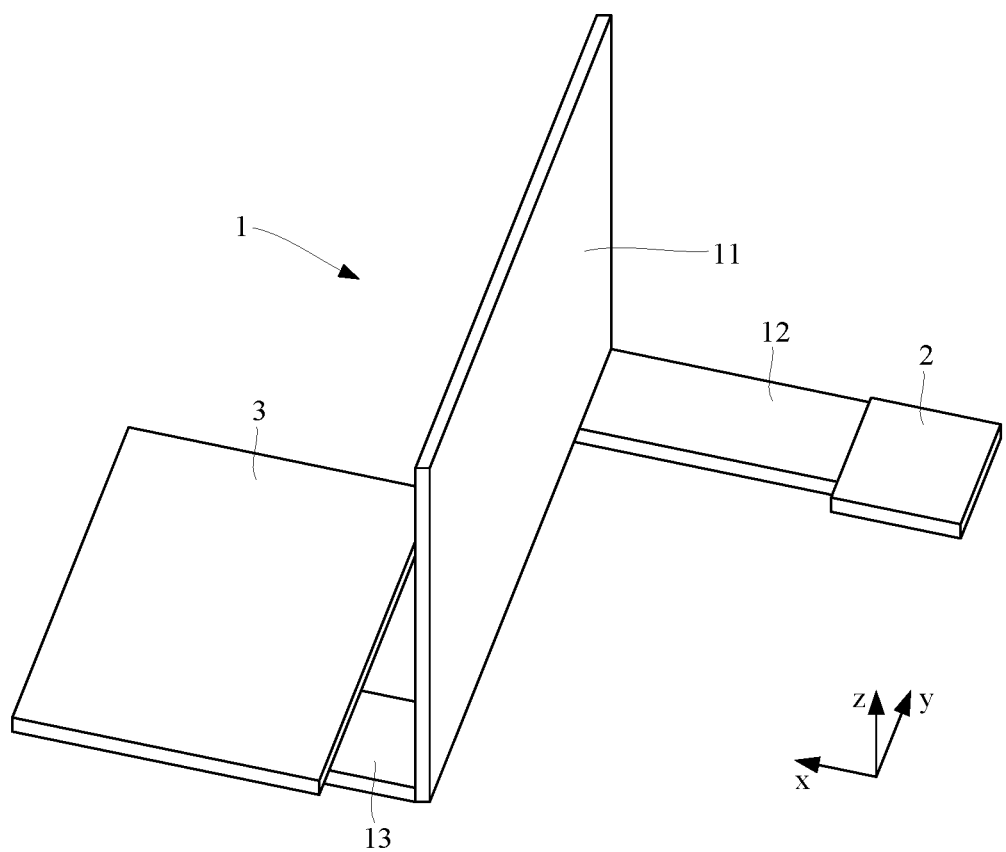
FIG. 2 is a schematic diagram showing a structure of a movable apparatus according to an example.

In an example, the main board 11 is a main portion of the flexible circuit board 1. One of the first connecting plate 12 and the second connecting plate 13 is configured to be connected to a fixed member 2, and the other one is configured to be connected to a movable member 3. For example, as shown in FIG. 2, the first connecting plate 12 is configured to be connected to the fixed member 2. The second connecting plate 13 is configured to be connected to the movable member 3. Thus, the fixed member 2 is electrically connected to the movable member 3 by using the flexible circuit board 1, so that data transmission between the fixed member 2 and the movable member 3 can be achieved. For example, the movable member 3 is an image sensor assembly. The fixed member 2 is an interface part. The movable member 3 can transmit collected image data to the fixed member 2 by using the flexible circuit board 1, so that the fixed member 2 transmits the image data to a motherboard at which the fixed member is located to perform image processing.

The length and width of the main board 11 can be flexibly selected according to actual requirements. The length and width of the first connecting plate 12 can also be flexibly selected according to the actual requirements. Likewise, the length and width of the second connecting plate 13 can be flexibly selected according to the actual requirements as well. In this example, the length and width of the main board 11, the length and width of the first connecting plate 12, and the length and width of the second connecting plate 13 are not specifically limited.

In an example, the main board 11, the first connecting plate 12, and the second connecting plate 13 have the following connection relations: a side surface of the first connecting plate 12 is connected to a first side surface of the main board 11; a side surface of the second connecting plate 13 is connected to the first side surface of the main board 11; and the first side surface of the main board 11 is any side surface of the four side surfaces. That is to say, one side surface of the first connecting plate 12 and one side surface of the second connecting plate 13 are both connected to the same side surface of the main board 11.

An included angle between the first connecting plate 12 and the main board 11 is a first preset angle. An included angle between the second connecting plate 13 and the main board 11 is a second preset angle. The first preset angle and the second preset angle are both greater than 0 degree and less than 180 degrees.

In an example, as shown in FIG. 1, if the first connecting plate 12 and the second connecting plate 13 are located on different sides of the main board 11, that is, the first connecting plate 12 is located at a position of one plate surface of the main board 11 and the second connecting plate 13 is located at a position of the other plate surface of the main board 11, the first preset angle and the second preset angle are complementary.

In another example, if the first connecting plate 12 and the second connecting plate 13 are located on the same side of the main board 11, that is, the first connecting plate 12 and the second connecting plate 13 are both located at the position of one plate surface of the main board 11, the first preset angle equals the second preset angle.

In this example, whether the first connecting plate 12 and the second connecting plate 13 are located on the same side of the main board 11 or located on different sides of the main board 11 is not specifically limited, which can be flexibly selected according to the actual requirements. In this example, that the first connecting plate 12 and the second connecting plate 13 are located on different sides of the main board 11 can be taken as an example, as shown in FIG. 1.

In an example, as shown in FIG. 1, the first preset angle, for example, may be 90 degrees. The second preset angle, for example, may also be 90 degrees. Then, the main board 11 is vertically connected to the first connecting plate 12, and is vertically connected to the second connecting plate 13 as well.

In an example, the main board 11, the first connecting plate 12, and the second connecting plate 13 are able to be integrally formed. By firstly cutting the flexible circuit board 1, the main board 11, the first connecting plate 12, and the second connecting plate 13 are obtained. Then, through bending, the included angle is formed between the main board 11 and the first connecting plate 12, and the included angle is formed between the main board 11 and the second connecting plate 13. A junction of the main board 11 and the first connecting plate 12 is a bent position. A junction of the main board 11 and the second connecting plate 13 is a bent position.

As shown in FIG. 2, since the junction of the main board 11 and the first connecting plate 12 is bent, the main board 11 is easy to rotate relative to the first connecting plate 12 around the junction, so that the main board 11 is easy to move relative to the first connecting plate 12. Then, as shown in FIG. 2, when the movable member 3 is moved in an x-axis direction, the main board 11 rotates around the junction with the first connecting plate 12 to facilitate the movement of the movable member 3 in the x-axis direction, as a result of enhancing the movement effect of the movable member 3.

As shown in FIG. 2, the movement of the main board 11 is facilitated as a distance between the first connecting plate 12 and the second connecting plate 13 increases. Thus, the movement effect of the main board 11 is enhanced, and the movement effect of the movable member 3 is enhanced as well. Then, the first connecting plate 12 and the second connecting plate 13 may be located on two ends of the main board 11. For example, the first connecting plate 12 is adjacent to a first end of the main board 11, and the second connecting plate 13 is adjacent to a second end of the main board 11.

As shown in FIG. 2, the bending at the junction between the main board 11 and the first connecting plate 12 is able to enhance the movement effect of the movable member 3 in the x-axis direction. In order to enhance the movement effect of the movable member 3 in a y-axis direction, one possible implementation may be that, by lengthening the first connecting plate 12, the length of the first connecting plate 12 is longer, so as to cause the movable member 3 to swing in the y-axis direction more easily. Thus, the movement effect of the movable member 3 in the y-axis direction is able to be enhanced. Another possible implementation may be that the movement effect of the movable member 3 in the y-axis direction is enhanced by utilizing bending characteristics.

Figure 3:
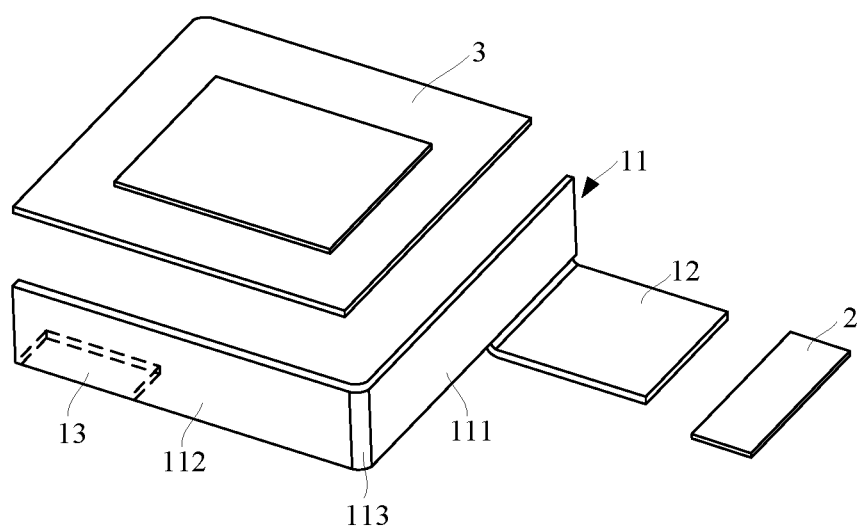
FIG. 3 is a schematic diagram showing an explosive structure of a movable apparatus according to an example.

As shown in FIG. 3, the main board 11 may be a bending plate, and may include a first straight plate portion 111, a second straight plate portion 112, and a bent portion 113. The bent portion 113 is connected between the first straight plate portion 111 and the second straight plate portion 112. The first connecting plate 12 is connected to the first straight plate portion 111. The second connecting plate 13 is connected to the second straight plate portion 112.

The first straight plate portion 111, the second straight plate portion 112, and the bent portion 113 are capable of being integrally formed. The main board 11 is bent at a first position between the first connecting plate 12 and the second connecting plate 13, to form the successively connected first straight plate portion 111, bent portion 113, and second straight plate portion 112.

In an example, the first position is determined based on the size setting requirements of the main board 11. For example, the first position may be determined based on the size of the movable member 3, so that the sizes of the first straight plate portion 111 and the second straight plate portion 112 are adapted to the movable member 3, e.g., smaller than or equal to the size of the movable member 3.

As shown in FIG. 2, before the main board 11 is bent, the first connecting plate 12 and the second connecting plate 13 are located on different sides of the main board 11, and then, after the main board 11 is bent, the following relation may be formed: as shown in FIG. 3, the first connecting plate 12 is located outside a space enclosed by the first straight plate portion 111, the second straight plate portion 112, and the bent portion 113, and the second connecting plate 13 is located inside the space enclosed by the first straight plate portion 111, the second straight plate portion 112, and the bent portion 113.

Definitely, after the main board 11 is bent, the following relation may also be formed: the first connecting plate 12 is located inside the space enclosed by the first straight plate portion 111, the second straight plate portion 112, and the bent portion 113, and the second connecting plate 13 is located outside the space enclosed by the first straight plate portion 111, the second straight plate portion 112, and the bent portion 113.

In this example, after the main board 11 is bent, the formed specific relation is not limited, which can be flexibly selected according to the actual requirements. In this example, an example can be given by forming the previous position relation.

In an example, the second connecting plate 13 is located inside the space enclosed by the first straight plate portion 111, the second straight plate portion 112, and the bent portion 113, and the second connecting plate 13 is connected to the movable member 3. Thus, accordingly, as shown in FIG. 4 and referring to FIG. 5, the movable member 3 is located inside the space enclosed by the first straight plate portion 111, the second straight plate portion 112, and the bent portion 113.

Figure 4:
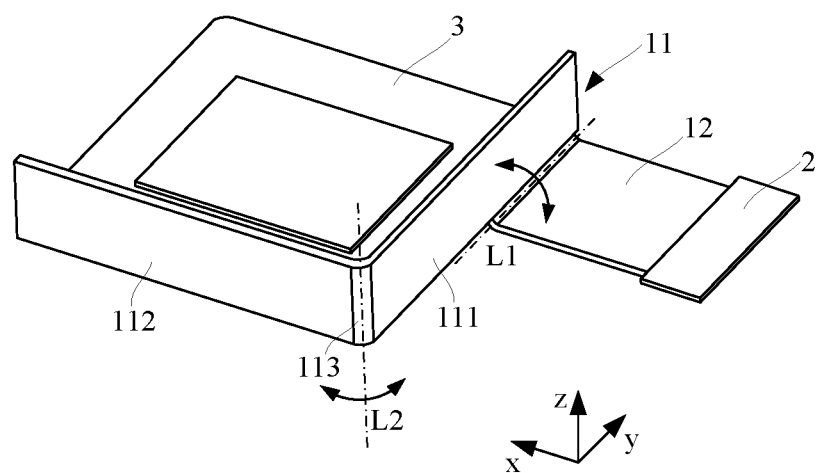
FIG. 4 is a schematic diagram showing a structure of a movable apparatus according to an example.
Figure 5:
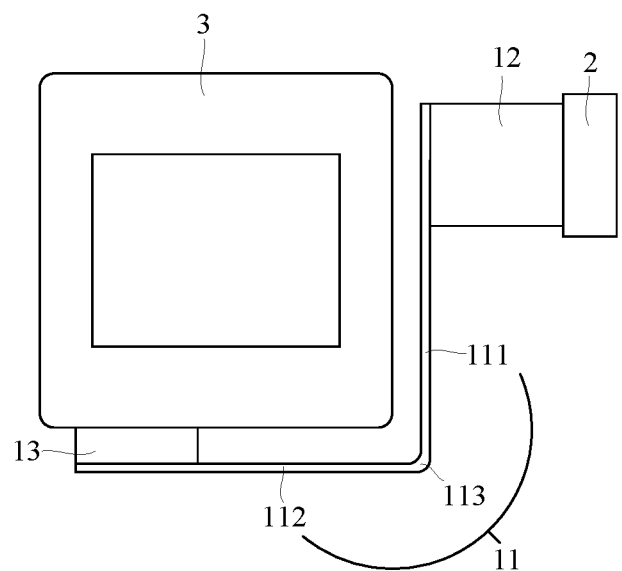
FIG. 5 is a schematic diagram showing a top view structure of a movable apparatus according to an example.

In this way, as shown in FIG. 4, since the junction between the first straight plate portion 111 and the first connecting plate 12 is bent, and the junction between the first straight plate portion 111 and the second straight plate portion 112 is bent, as shown in FIG. 4, the first straight plate portion 111 is easy to rotate around a straight line L1, and the second straight plate portion 112 is easy to rotate around a straight line L2. Thus, as shown in FIG. 4, the movable member 3 is easy to move in the x-axis direction and the y-axis direction both. In addition, the movable member 3 is also easy to rotate around a y axis and a z axis, as a result of enhancing the movement effect of the movable member 3.

In an example, as shown in FIG. 2 and FIG. 3, the main board 11 is in an upright state relative to the first connecting plate 12 and the second connecting plate 13. Since the main board 11 has a relatively small thickness but is insufficient in rigidity, in order to increase the rigidity of the main board 11, a support plate can be fixed on a plate surface of the main board 11 accordingly. For example, the support plate of which the area matches the area of the main board 11 can be fixed on the plate surface of the main board 11 shown in the FIG. 2 to increase the rigidity of the main board 11, so as to avoid the main board 11 from collapsing.

Figure 6:
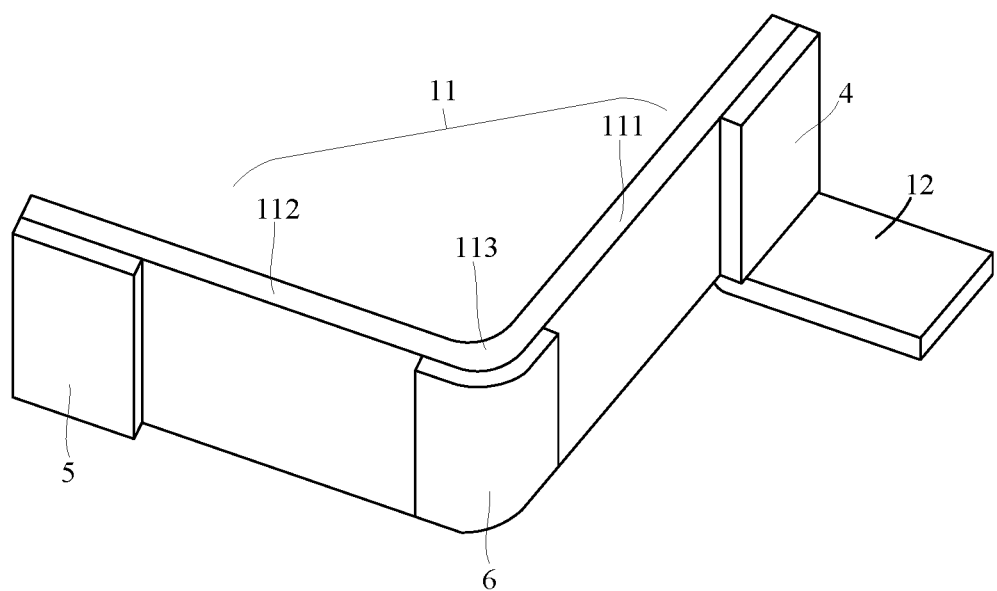
FIG. 6 is a schematic diagram showing a structure of a flexible circuit board according to an example.

For another example, as shown in FIG. 6, the support plate can be fixed on a plate surface of the first straight plate portion 111 of the main board 11, the support plate can be fixed on a plate surface of the bent portion 113 of the main board 11, and the support plate can be fixed on a plate surface of the second straight plate portion 112 of the main board 11, so as to increase the rigidity of the main board 11.

The support plate may be a steel plate, and the steel plate may also be a steel sheet. The support plate fixed on the first straight plate portion 111 may be recorded as a first support plate 4, the support plate fixed on the second straight plate portion 112 may be recorded as a second support plate 5, and the support plate fixed on the bent portion 113 may be recorded as a third support plate 6.

In an example, as shown in FIG. 6, the first support plate 4 may be fixed on the plate surface of the first straight plate portion 111 close to the first connecting plate 12, and the second support plate 5 may be fixed on the plate surface of the second straight plate portion 112 close to the second connecting plate 13.

As shown in FIG. 6, the first support plate 4, the second support plate 5, and the third support plate 6 may be fixed on the same plate surface of the main board 11. Definitely, the first support plate 4, the second support plate 5, and the third support plate 6 may also be fixed on different plate surfaces of the main board 11. This example does not make limitations thereto, and can flexibly select according to the actual requirements. This example can take the former as an example.

In an example, since there are many traces in the flexible circuit board 1, the width of the main board 11 is relatively large. That is to say, as shown in FIG. 2 and FIG. 3, the height of the main board 11 is relatively high, in order to save space in the vertical direction, the main board 11 can be folded in half accordingly to reduce the height of the main board 11.

In an example, the main board 11 may have a multi-layer structure of greater than or equal to two layers. The multi-layer structure may be formed by folding the same flexible circuit board.

In an example, the main board 11 is folded in half to form a first folded layer 114 and a second folded layer 115, that is, the main board 11 which is formed by folding in half may be a double-layer structure having the first folded layer 114 and the second folded layer 115. Further, in an example, the first folded layer 114 may be folded in half again and the second folded layer 115 may be folded in half again, so that the main board 11 is formed into a four-layer structure. The main board 11 may be folded in half along an axis parallel to the length direction of the main board 11 to form the first folded layer 114 and the second folded layer 115.

Figure 9:
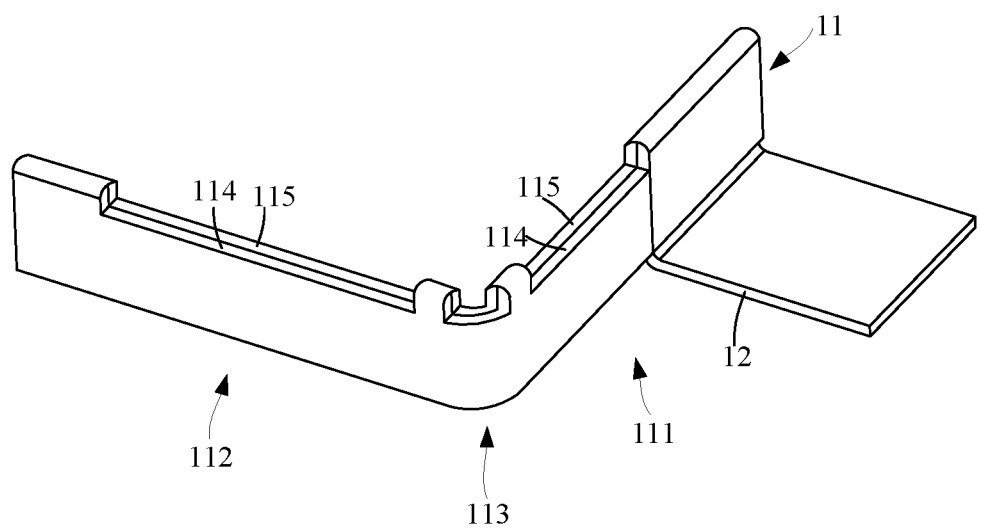
FIG. 9 is a schematic diagram showing a structure of a flexible circuit board according to an example.
Figure 10:
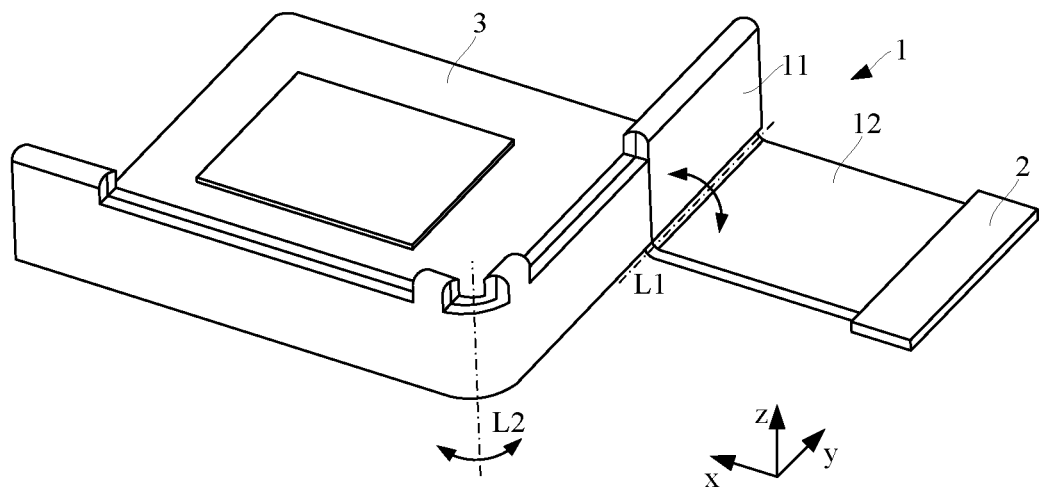
FIG. 10 is a schematic diagram showing a structure of a movable apparatus according to an example.

For example, as shown in FIG. 9, by folding the main board 11 in half at a second position between a first side surface and a second side surface to form the first folding layer 114 and the second folding layers 115, the first straight plate portion 111, the second straight plate portion 112, and the bent portion 113 each includes the first folding layer 114 and the second folding layers 115. The first side surface is a side surface that is connected to the first connecting plate 12 and the second connecting plate 13. The second side surface is a side surface opposite to the first side surface.

The second position may be any of axis of the main board 11 which is located between the first side surface and the second side surface and is parallel to the length direction of the main board 11.

Figure 7:
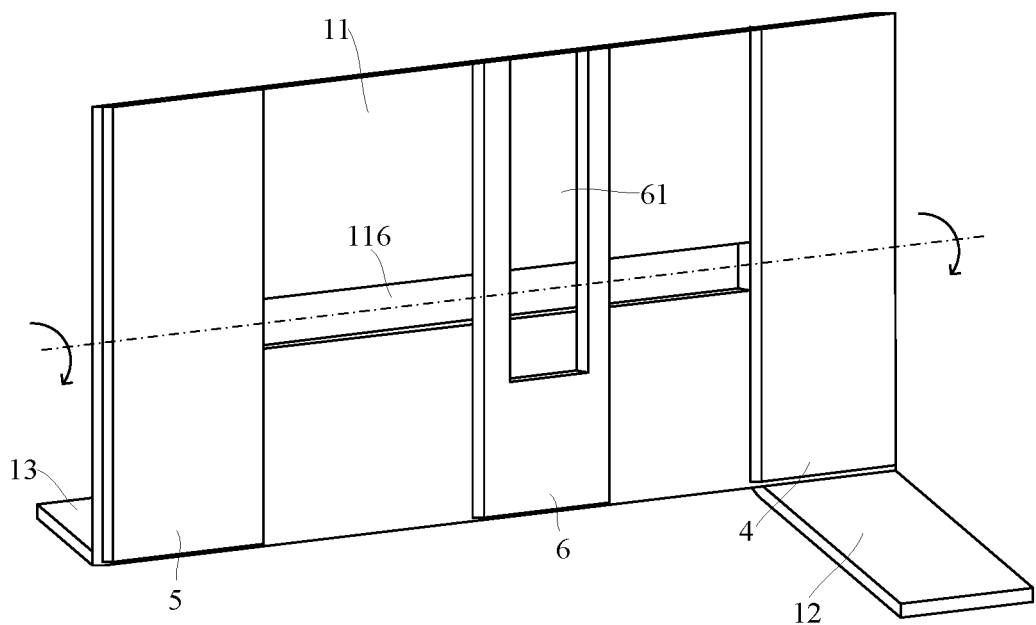
FIG. 7 is a schematic diagram showing a flexible circuit board folded in half according to an example.
Figure 8:
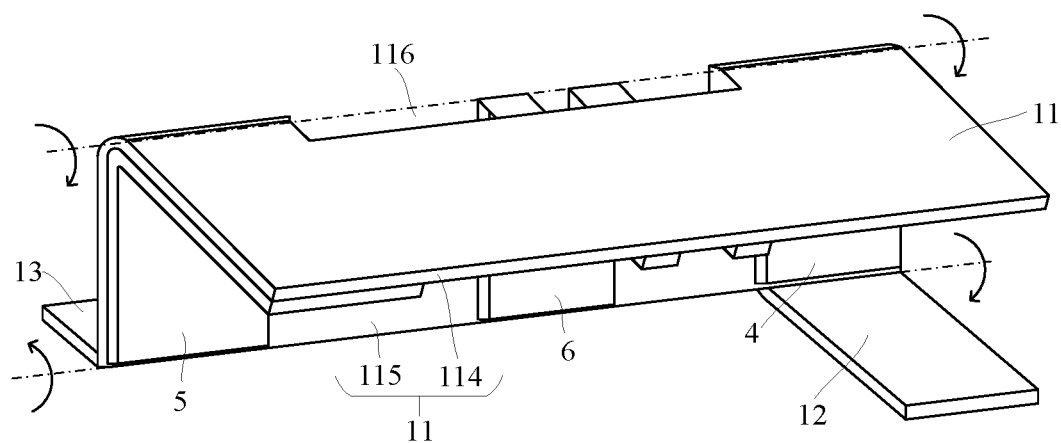
FIG. 8 is a schematic diagram showing a flexible circuit board folded in half according to an example.

In an example, before being bent to form the first straight plate portion 111, the second straight plate portion 112, and the bent portion 113, the main board 11 may be folded in half firstly to form the first folding layers 114 and the second folding layers 115, as shown in FIG. 7 and FIG. 8. Then, the folded main board 11 is bent, for example, is able to be bent at a right angle to form the first straight plate portion 111, the second straight plate portion 112, and the bent portion 113, as shown in FIG. 8 and FIG. 9.

As shown in FIG. 9, each of the first straight plate portion 111, the second straight plate portion 112, and the bent portion 113 may include the first folding layer 114 and the second folding layer 115. As shown in FIG. 8 and referring to FIG. 9, the first support plate 4 is located between the first folding layer 114 and second folding layer 115 of the first straight plate portion 111, the second support plate 5 is located between the first folding layer 114 and second folding layer 115 of the second straight plate portion 112, and the third support plate 6 is located between the first folding layer 114 and second folding layer 115 of the bent portion 113.

In an example, when the first folding layers 114 and second folding layers 115 are formed by folding the main board 11 in half, the main board 11 may be torn and cracked at a junction of the first folding layers 114 and second folding layers 115. In order to avoid the above situation, as shown in FIG. 7, the junction of the first folding layers 114 and second folding layers 115 has a strip-shaped notch 116 accordingly.

Since the support plates on the main board 11 are clamped when the main board 11 is folded in half, the junction of the first folding layers 114 and second folding layers 115 is not easy to tear and crack. Thus, a position of the strip-shaped notch 116 can be staggered with a position of the first support plate 4 and a position of the second support plate 5. For example, the strip-shaped notch 116 may be located at a position corresponding to a position between the first support plate 4 and the second support plate 5 on the main board 11.

In an example, the strip-shaped notch 116 may penetrate the main board 11, that is, the strip-shaped notch 116 penetrates the two plate surfaces of the main board 11.

In an example, when the first folding layers 114 and second folding layers 115 are formed by folding the main board 11 in half, and when the first straight plate portion 111, the second straight plate portion 112, and the bent portion 113 are formed by bending the main board, bulges are formed at the folded and bent junction, and tearing and cracking may also occur. In order to avoid the situation, accordingly, the third support plate 6 may be a U-shaped support plate, and the position of the strip-shaped notch 116 is opposite to a position of a notch 61 of the U-shaped support plate. Thus, as shown in FIG. 9, the main board 11 has the notch at the folded and bent junction, so that the formation of the bulges can be prevented.

The third support plate 6 may be the U-shaped support plate, and the U-shaped support plate may also be a steel fork.

In an example, the position of the strip-shaped notch 116 is opposite to the position of the notch 61 of the third support plate 6. That is to say, as shown in FIG. 7, the notch 61 of the third support plate 6 is located under the strip-shaped notch 116, so that the bent portion 113 and the third support plate 6 have the notches at the folded and bent junction corresponding to the main board 11.

In an example of this application, the flexible circuit board 1 may include the main board 11, the first connecting plate 12, and the second connecting plate 13. Since the junction of the main board 11 and the first connecting plate 12 is bent, the main board 11 is easy to rotate relative to the first connecting plate 12 around the junction, so that the main board 11 is easy to move relative to the first connecting plate 12. Then, when the movable member 3 is moved, the main board 11 can rotate around the junction with the first connecting plate 12 to facilitate the movement of the movable member 3, as a result of enhancing the movement effect of the movable member 3.

An example of this application further provides a method for manufacturing a flexible circuit board. The method is used for manufacturing the above flexible circuit board 1.

Figure 11:
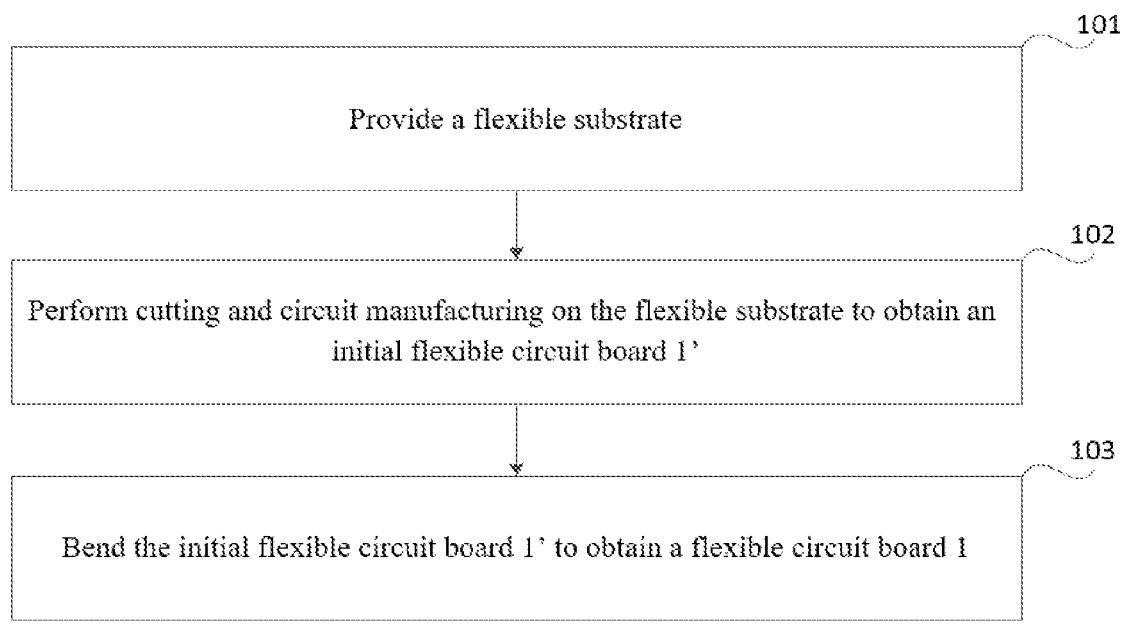
FIG. 11 is a schematic flowchart showing a method for manufacturing a flexible circuit board according to an example.

The method may be performed according to a process shown in FIG. 11.

In step 101, a flexible substrate is provided.

In step 102, cutting and circuit manufacturing are performed on the flexible substrate to obtain an initial flexible circuit board 1'.

In an example, the flexible substrate may be cut first, and then circuit manufacturing is performed. Alternatively, circuit manufacturing may also be performed first, and then cutting is performed. Alternatively, cutting may be performed during circuit manufacturing. For example, one way may be that, circuit manufacturing may include trace laying and component welding, the flexible substrate may be cut first, and then trace laying is performed, followed by component welding. In this example, a process from the flexible substrate to the initial flexible circuit board 1' is not limited, which can be flexibly select according to actual requirements.

Figure 12:
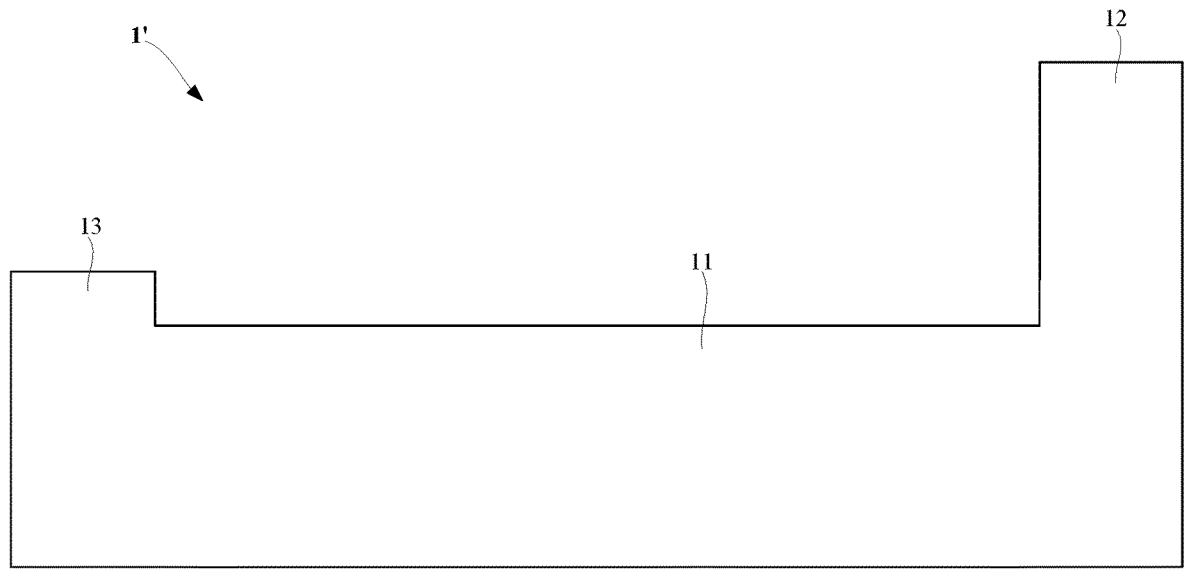
FIG. 12 is a schematic diagram showing a flexible circuit board obtained by an initial flexible circuit board according to an example.
Figure 12:
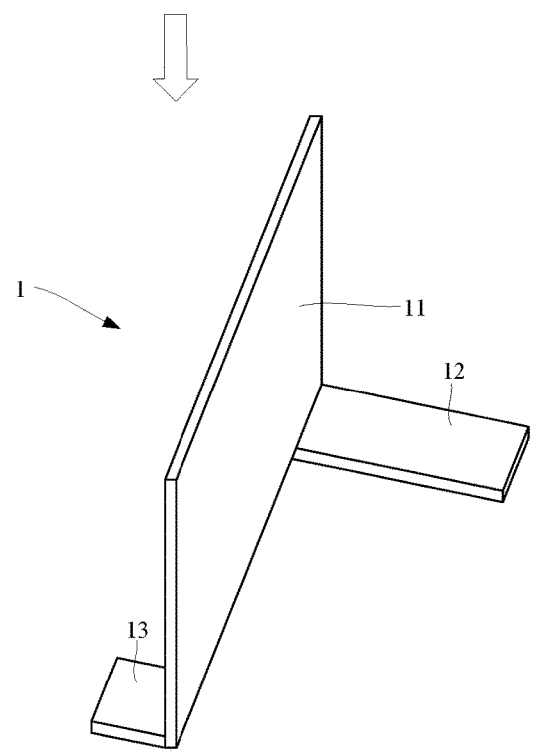

As shown in FIG. 12, the initial flexible circuit board 1' formed after cutting and circuit manufacturing may include a main board 11, a first connecting plate 12, and a second connecting plate 13. A side surface of the first connecting plate 12 and a side surface of the second connecting plate 13 are both connected to a first side surface of the main board 11.

It should be noted that, as shown in FIG. 12, the main board 11, the first connecting plate 12, and the second connecting plate 13 in the initial flexible circuit board 1' are coplanar. That is to say, the main board, the first connecting plate, and the second connecting plate are located in a same plane.

In step 103, the initial flexible circuit board 1' is bent to obtain a flexible circuit board 1.

The flexible circuit board 1 is a structure formed after the initial flexible circuit board 1' is bent. Then, the flexible circuit board 1 is the bent initial flexible circuit board 1', and the initial flexible circuit board 1' is the flexible circuit board 1 before bending.

Thus, the flexible circuit board 1 formed after the initial flexible circuit board 1' is bent may include the main board 11, the first connecting plate 12, and the second connecting plate 13, but the main board 11, the first connecting plate 12, and the second connecting plate 13 of the flexible circuit board 1 obtained after bending are no longer coplanar.

An included angle between the main board 11 and the first connecting plate 12 of the flexible circuit board 1 may be a first preset angle. An included angle between the main board 11 and the second connecting plate 13 of the flexible circuit board 1 may be a second preset angle. The first preset angle and the second preset angle are both greater than 0 degree and less than 180 degrees.

A relation between the first preset angle and the second preset angle, as well as values of the first preset angle and the second preset angle can refer to the above, which is not repeated herein.

Figure 13:
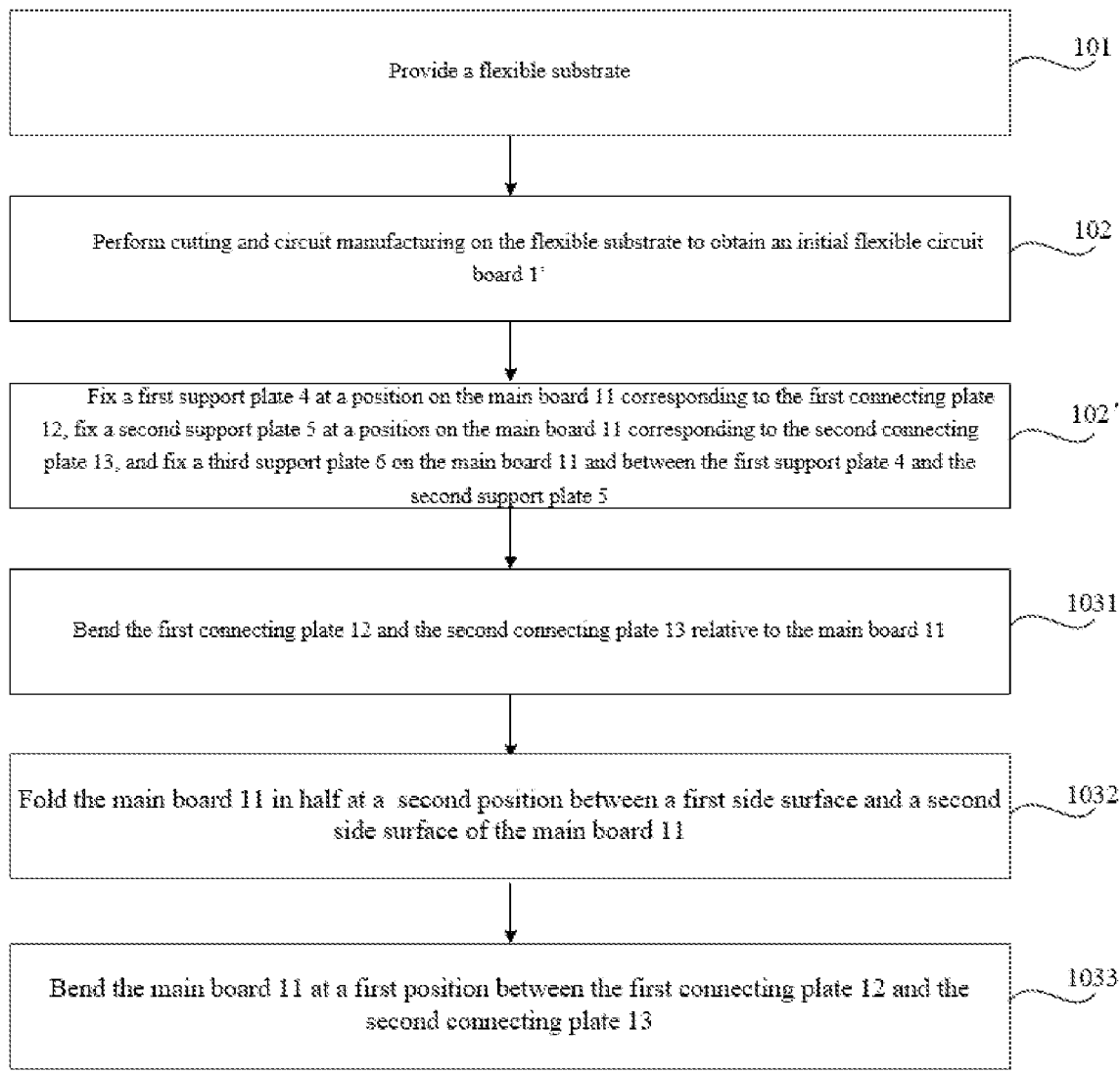
FIG. 13 is a schematic flowchart showing a method for manufacturing a flexible circuit board according to an example.

In a possible implementation, as shown in FIG. 13, the operation of bending the initial flexible circuit board 1' may include a step 1031.

In step 1031, the first connecting plate 12 and the second connecting plate 13 of the initial flexible circuit board 1' are both bent relative to the main board 11 of the initial flexible circuit board 1'.

The first connecting plate 12 and the second connecting plate 13 of the flexible circuit board 1 may be located on different sides of the main board 11. Accordingly, step 1031 of bending the first connecting plate 12 and the second connecting plate 13 relative to the main board 11 may include: bending the first connecting plate 12 relative to the main board 11 in a first direction, and bending the second connecting plate 13 relative to the main board 11 in a second direction, the first direction being opposite to the second direction, so as to obtain a situation that the first connecting plate 12 and the second connecting plate 13 are located on different sides of the main board 11 as shown in FIG. 12, a bending process referring to FIG. 12.

The first connecting plate 12 and the second connecting plate 13 of the flexible circuit board 1 may also be located on a same side of the main board 11. Accordingly, step 1031 of bending the first connecting plate 12 and the second connecting plate 13 relative to the main board 11 may include: bending the first connecting plate 12 relative to the main board 11 in the first direction, and bending the second connecting plate 13 relative to the main board 11 in the first direction as well.

In a possible implementation, as shown in FIG. 13, between step 102 and step 1031, the method may further include step 102'.

In step 102', a first support plate 4 is fixed at a position on the main board 11 corresponding to the first connecting plate 12, a second support plate 5 is fixed at a position on the main board 11 corresponding to the second connecting plate 13, and a third support plate 6 is fixed on the main board 11 and between the first support plate 4 and the second support plate 5.

Figure 14:
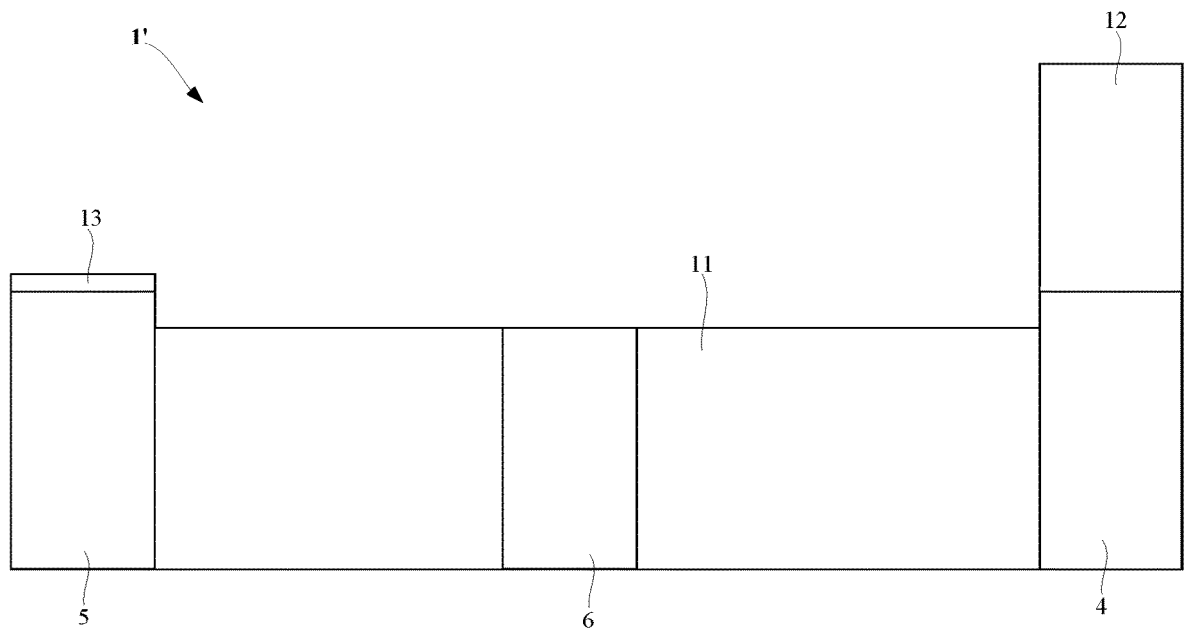
FIG. 14 is a schematic diagram showing a structure of an initial flexible circuit board according to an example.

The initial flexible circuit board 1' fixed with support plates may refer to a schematic structural diagram shown in FIG. 14.

In a possible implementation, after step 1031, step 103 may further include step 1032.

In step 1032, the main board 1 is folded in half at a second position between the first side surface and a second side surface of the main board 11, the position of the first side surface is opposite to the position of the second side surface, and a folding process may refer to FIG. 8.

In an example, the main board 11 may have a multi-layer structure of greater than or equal to two layers. The multi-layer structure may be formed by folding the same flexible circuit board.

In an example, the main board 11 may be folded in half along an axis parallel to the length direction of the main board 11 to form the first folded layer 114 and the second folded layer 115, that is, the main board 11 which is formed by folding in half may be a double-layer structure having the first folded layer 114 and the second folded layer 115. Further, in an example, the first folded layer 114 may be folded in half again and the second folded layer 115 may be folded in half again, so that the main board 11 is formed into a four-layer structure. The main board 11 may be folded in half along an axis parallel to the length direction of the main board 11 to form the first folded layer 114 and the second folded layer 115.

In a possible implementation, as shown in FIG. 13, after step 1032, step 103 may further include step 1033.

In step 1033, the main board 11 is bent at a first position between the first connecting plate 12 and the second connecting plate 13, and a bending process may refer to FIG. 9.

Figure 15:
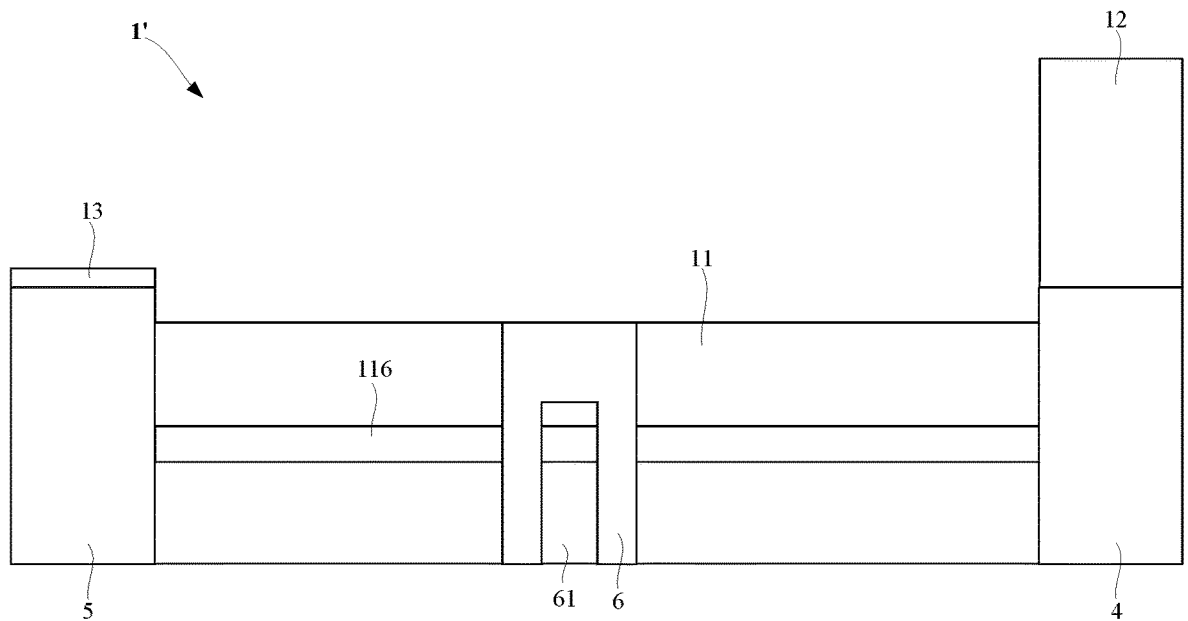
FIG. 15 is a schematic diagram showing a structure of an initial flexible circuit board according to an example.

As shown in FIG. 15, in the cut initial flexible circuit board 1', its main board 11 may have a strip-shaped notch 116. The strip-shaped notch 116 is located between the first side surface and the second side surface, and corresponds to the position between the first connecting plate 12 and the second connecting plate 13. The first side surface of the main board 11 is a side surface that is connected to the first connecting plate 12 and the second connecting plate 13. The second side surface is a side surface opposite to the first side surface in position.

In an example, the strip-shaped notch 116 may penetrate the main board 11, that is, the strip-shaped notch 116 penetrates the two plate surfaces of the main board 11.

Thus, step 1032 may include folding the main board 11 in half at a center line of the strip-shaped notch 116.

In this way, according to a process shown in FIG. 13, the flexible circuit board 1 shown in FIG. 9 can be obtained.

In an example of this application, the flexible circuit board includes the main board, the first connecting plate, and the second connecting plate. The first connecting plate is connected to the main board, and an included angle is formed between the first connecting plate and the main board. Since the included angle is formed between the main board and the first connecting plate, a junction of the main board and the first connecting plate is bent. Then, the main board is easy to rotate relative to the first connecting plate around the junction, so that the main board is easy to move relative to the first connecting plate. Then, when the movable member connected to the second connecting plate is moved, the main board can rotate around the junction with the first connecting plate to facilitate the movement of the movable member, as a result of enhancing the movement effect of the movable member.

An example of this application further provides a movable apparatus. As shown in FIG. 1, the movable apparatus may include a fixed member 2, a movable member 3, and the above flexible circuit board 1. One of a first connecting plate 12 and a second connecting plate 13 of a flexible circuit board 1 is connected to the fixed member 2, and the other one is connected to the movable member 3. For example, as shown in FIG. 2, the first connecting plate 12 is connected to the fixed member 2. The second connecting plate 13 is connected to the movable member 3.

In an example, the movable apparatus may be a camera module. The movable member 3 may be an image sensor assembly. The image sensor assembly may include an image sensor and a circuit board. The image sensor is fixed on the circuit board. The fixed member 2 may be an interface part. The interface part is fixed on a motherboard at which the camera module is located. The movable member 3 may be electronically connected to the fixed member 2 by using the flexible circuit board 1.

Thus, the movable member 3 may transmit image data to the fixed member 2 by using the flexible circuit board 1. The fixed member 2 then forwards the image data to the motherboard. The motherboard may transmit a control signal to the fixed member 2, and then forwards the control signal to the movable member 3 by using the flexible circuit board 1.

As described above, the flexible circuit board of the movable apparatus includes the main board, the first connecting plate, and the second connecting plate. The first connecting plate is connected to the main board, and an included angle is formed between the first connecting plate and the main board. Since the included angle is formed between the main board and the first connecting plate, a junction of the main board and the first connecting plate is bent. Then, the main board is easy to rotate relative to the first connecting plate around the junction, so that the main board is easy to move relative to the first connecting plate. Then, when the movable member connected to the second connecting plate is moved, the main board can rotate around the junction with the first connecting plate to facilitate the movement of the movable member, as a result of enhancing the movement effect of the movable member.

An example of this application further provides an electronic device. The electronic device may include the above movable apparatus.

The electronic device may be a camera device, for example, may specifically be a mobile phone, a tablet computer, or a digital camera.

The movable apparatus of the electronic device includes the above flexible circuit board. The flexible circuit board includes a main board, a first connecting plate, and a second connecting plate. The first connecting plate is connected to the main board, and an included angle is formed between the first connecting plate and the main board. Since the included angle is formed between the main board and the first connecting plate, a junction of the main board and the first connecting plate is bent. Then, the main board is easy to rotate relative to the first connecting plate around the junction, so that the main board is easy to move relative to the first connecting plate. Then, when the movable member connected to the second connecting plate is moved, the main board can rotate around the junction with the first connecting plate to facilitate the movement of the movable member, as a result of enhancing the movement effect of the movable member.

It should be understood that this application is not limited to the exact construction that has been described above and illustrated in the accompanying drawings, and that various modifications and changes may be made without departing from the scope of the present application. The scope of this application is only be limited by the appended claims.

The invention claimed is:

1. A flexible circuit board, comprising a main board, a first connecting plate, and a second connecting plate, wherein
   a side surface of the first connecting plate is connected to a first side surface of the main board, and an included angle between the main board and the first connecting plate is a first preset angle;
   a side surface of the second connecting plate is connected to the first side surface of the main board, and an included angle between the main board and the second connecting plate is a second preset angle;
   the first preset angle and the second preset angle are both greater than 0 degree and less than 180 degrees;
   the main board is a bending plate and comprises a first straight plate portion, a second straight plate portion, and a bent portion;
   the bent portion is connected between the first straight plate portion and the second straight plate portion;
   the first connecting plate is connected to the first straight plate portion, and the second connecting plate is connected to the second straight plate portion; and
   the first connecting plate is located outside a space enclosed by the first straight plate portion, the second straight plate portion, and the bent portion; and the second connecting plate is located inside the space enclosed by the first straight plate portion, the second straight plate portion, and the bent portion.

2. The flexible circuit board according to claim 1, wherein the main board, the first connecting plate, and the second connecting plate are integrally formed.

3. The flexible circuit board according to claim 1, wherein the first preset angle and the second preset angle are both 90 degrees.

4. The flexible circuit board according to claim 1, wherein the main board is folded in half at a second position between the first side surface and a second side surface to form a first folding layer and a second folding layer, each of the first straight plate portion, the second straight plate portion, and the bent portion comprises the first folding layer and the second folding layer, wherein a position of the first side surface is opposite to a position of the second side surface.

5. The flexible circuit board according to claim 1, wherein the main board is folded in half at a second position between the first side surface and a second side surface to form a first folding layer and a second folding layer, the first straight plate portion, the second straight plate portion, and the bent portion each comprises the first folding layer and the second folding layer, wherein a position of the first side surface is opposite to a position of the second side surface.

6. The flexible circuit board according to claim 4, wherein the flexible circuit board further comprises a first support plate, a second support plate, and a third support plate; wherein the first support plate is located between the first folding layer and the second folding layer of the first straight plate portion, the second support plate is located between the first folding layer and the second folding layer of the second straight plate portion, and the third support plate is located between the first folding layer and the second folding layer of the bent portion.

7. The flexible circuit board according to claim 6, wherein a junction of the first folding layer and the second folding layer has a strip-shaped notch; and a position of the strip-shaped notch is mutually staggered with a position of the first support plate and a position of the second support plate.

8. The flexible circuit board according to claim 7, wherein the third support plate is a U-shaped support plate, and the position of the strip-shaped notch is opposite to a position of a notch of the U-shaped support plate.

9. A method for manufacturing a flexible circuit board, the method comprising:

providing a flexible substrate;

performing cutting and circuit manufacturing on the flexible substrate to obtain an initial flexible circuit board, wherein the initial flexible circuit board comprises a main board, a first connecting plate, and a second connecting plate, and a side surface of the first connecting plate and a side surface of the second connecting plate are both connected to a first side surface of the main board; and bending the initial flexible circuit board to obtain the flexible circuit board, wherein an included angle between the main board and the first connecting plate of the flexible circuit board is a first preset angle, an included angle between the main board and the second connecting plate of the flexible circuit board is a second preset angle, and the first preset angle and the second preset angle are both greater than 0 degree and less than 180 degrees;

wherein bending the initial flexible circuit board comprises:

folding the main board in half at a second position between the first side surface and a second side surface of the main board, a position of the first side surface being opposite to a position of the second side surface;

bending the first connecting plate and the second connecting plate relative to the main board; and bending the main board at a first position between the first connecting plate and the second connecting plate.

10. The method according to claim 9, wherein bending the first connecting plate and the second connecting plate relative to the main board comprises:

bending the first connecting plate in a first direction relative to the main board, and bending the second connecting plate in a second direction relative to the main board, the first direction being opposite to the second direction.

11. The method according to claim 10, wherein after bending the first connecting plate and the second connecting plate relative to the main board, the method further comprising:

bending the main board at a first position between the first connecting plate and the second connecting plate.

12. The method according to claim 9, wherein before bending the first connecting plate in a first direction relative to the main board, and bending the second connecting plate in a second direction relative to the main board, the method further comprising:

fixing a first support plate at a position on the main board corresponding to the first connecting plate, fixing a second support plate at a position on the main board corresponding to the second connecting plate, and fixing a third support plate on the main board and between the first support plate and the second support plate.

13. The method according to claim 12, wherein the main board of the initial flexible circuit board has a strip-shaped notch, and the strip-shaped notch is located between the first side surface and the second side surface and corresponds to the position between the first connecting plate and the second connecting plate;

wherein folding the main board in half at the second position between the first side surface and the second side surface of the main board comprises: folding the main board in half at a center line of the strip-shaped notch.

14. A movable apparatus, comprising a fixed member, a movable member, and a flexible circuit board, wherein the flexible circuit board comprises a main board, a first connecting plate, and a second connecting plate; wherein a side surface of the first connecting plate is connected to a first side surface of the main board, and an included angle between the main board and the first connecting plate is a first preset angle; and wherein a side surface of the second connecting plate is connected to the first side surface of the main board, and an included angle between the main board and the second connecting plate is a second preset angle, wherein the first preset angle and the second preset angle are both greater than 0 degree and less than 180 degrees, the main board is a bending plate and comprises a first straight plate portion, a second straight plate portion, and a bent portion, the bent portion is connected between the first straight plate portion and the second straight plate portion, the first connecting plate is connected to the first straight plate portion, and the second connecting plate is connected to the second straight plate portion, and the first connecting plate is located outside a space enclosed by the first straight plate portion, the second straight plate portion, and the bent portion; and the second connecting plate is located inside the space enclosed by the first straight plate portion, the second straight plate portion, and the bent portion; wherein one of the first connecting plate and the second connecting plate of the flexible circuit board is connected to the fixed member, and the other one is connected to the movable member.

15. An electronic device comprising the movable apparatus according to claim 14.

* * * * *